(12) United States Patent
Liao et al.

(10) Patent No.: US 7,923,921 B2
(45) Date of Patent: Apr. 12, 2011

(54) ORGANIC ELECTROLUMINESCENT DEVICE

(75) Inventors: Jung-Yu Liao, Hsinchu County (TW);
Pei-Ching Liu, Miaoli (TW);
Mei-Rurng Tseng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 410 days.

(21) Appl. No.: 11/937,453

(22) Filed: Nov. 8, 2007

(65) Prior Publication Data
US 2008/0157656 A1 Jul. 3, 2008

(30) Foreign Application Priority Data
Dec. 27, 2006 (TW) ................ 95149197 A

(51) Int. Cl.
*H01J 1/62* (2006.01)
(52) U.S. Cl. ........................ 313/504; 313/512
(58) Field of Classification Search .......... 313/502–506, 313/512
See application file for complete search history.

(56) References Cited

U.S. PATENT DOCUMENTS

| 6,465,953 | B1 | 10/2002 | Duggal |
| 6,998,648 | B2 * | 2/2006 | Silvernail ............... 257/99 |
| 2004/0119068 | A1 * | 6/2004 | Weaver ................. 257/40 |
| 2006/0033433 | A1 * | 2/2006 | Carr ...................... 313/546 |
| 2006/0148366 | A1 | 7/2006 | Dings et al. |

* cited by examiner

*Primary Examiner* — Joseph L Williams
*Assistant Examiner* — Brenitra M Lee

(57) ABSTRACT

An organic electroluminescent device. The organic electroluminescent device comprises a first barrier layer disposed on a substrate; organic electroluminescent elements disposed over the first barrier layer and encapsulated with a second barrier layer; and a getter layer disposed between the first and second barrier layers. Each of the first and second barrier layers includes an organic layer and an inorganic layer covering the top and sidewall surfaces of the organic layer, thus providing stacked inorganic sidewalls to hinder moisture and oxygen.

17 Claims, 4 Drawing Sheets

ORGANIC ELECTROLUMINESCENT DEVICE

FIELD OF THE INVENTION

The invention relates to an organic electroluminescent device, and more particularly to a flexible organic electroluminescent device providing sidewalls to hinder moisture and oxygen.

DESCRIPTION OF THE RELATED ART

An organic electroluminescent device (OLED) has advantages such as, a light weight, self-luminescence, low power consumption, no backlight requirement, no view angle limitation and a high response rate, thus, making it applicable for flat panel displays. However, this kind of self-luminescent element requires operating in an environment without moisture and oxygen to ensure prolonged operational life thereof.

A conventional organic electroluminescent device has getters disposed in a space of a substrate for adsorbing moisture and oxygen. U.S. Pat. No. 6,465,953 discloses an organic electroluminescent device, which disperses a plurality of getter particles in the substrate to adsorb moisture and oxygen. However, the getter particles near the sidewalls of the substrate are rapidly saturated with moisture and oxygen. U.S. Patent No. 2006/0148366 discloses a polymer OLED, which covers the OLED with an encapsulant containing getters for adsorbing moisture and oxygen. However, the getters near the sidewalls of the encapsulant are also rapidly saturated with moisture and oxygen.

U.S. Pat. No. 6,998,648 discloses an organic electroluminescent device, wherein getters are adhered to an upper cover and disposed between the upper cover and a lower substrate for adsorbing moisture and oxygen. The upper cover and the lower substrate are sealed with an adhesion layer. The adhesion layer needs to be thickened for the getters in the OLED structure. Thus, increasing the area for moisture and oxygen to permeate through the sidewalls.

Although the above organic electroluminescent devices have getters to adsorb moisture and oxygen, some moisture and oxygen still permeate into the OLED. Furthermore, for a flexible organic electroluminescent, because the space of the device is not fixed, other elements are more likely to be damaged by the getters.

Therefore, an organic electroluminescent device that is able to effectively hinder moisture and oxygen and is applicable for a flexible organic electroluminescent device is desired.

BRIEF SUMMARY OF THE INVENTION

The invention utilizes a structural design of a getter layer and a barrier layer to form an organic electroluminescent device (OLED), which can adsorb moisture and oxygen in the OLED and effectively hinder moisture and oxygen from permeating through the sidewalls of the OLED. Moreover, the invention is applicable for flexible OLEDs.

The invention provides an organic electroluminescent device comprising a first barrier layer disposed on a substrate. An organic electroluminescent element is disposed over the first barrier layer and encapsulated with a second barrier layer. A getter layer is disposed between the first and second barrier layers. Each of the first and second barrier layers include an organic layer and an inorganic layer covering top and sidewall surfaces of the organic layer, such that the inorganic layers of the first and the second barrier layers are adjoined at the sidewalls.

A detailed description is given in the following embodiments with reference to the accompanying drawings.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. The description is provided for illustrating the general principles of the invention and is not meant to be limiting. The scope of the invention is best determined by reference to the appended claims.

The invention utilizes a plurality of getter particles mixed into a matrix of a getter layer and then disposes the getter layer between a barrier layer and an organic electroluminescent element by mechanical coating. The getter layer can adsorb moisture and oxygen in an organic electroluminescent device. Additionally, the barrier layer over the organic electroluminescent element is formed by thin-film encapsulating technology, thus effectively hindering moisture and oxygen from passing through the sidewalls into the OLED.

Figure 1:
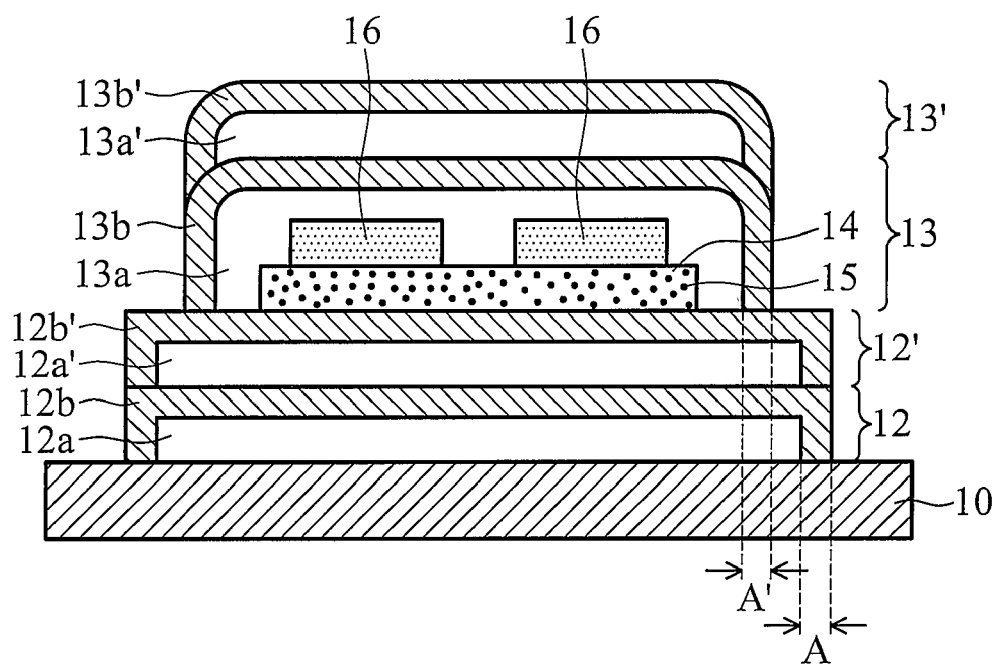
FIG. 1 shows a schematic cross section of an organic electroluminescent device of embodiment 1 of the invention.

In embodiment 1 of the invention, the cross section of an organic electroluminescent device is shown as FIG. 1, wherein a getter layer 14 is disposed under an organic electroluminescent element 16. A substrate 10, such as plastic substrate or other flexible substrates, is first provided. Two barrier layers 12 and 12' are formed on the substrate 10 by vacuum coating. FIG. 1 shows two barrier layers as an example, however one skilled in the art can readily appreciate that one or more than two barrier layers can be formed on the substrate.

First, an organic layer 12a is formed by vacuum vapor deposition, and then an inorganic layer 12b is formed by sputtering or chemical vapor deposition to completely cover the top and sidewall surfaces of the organic layer 12a forming the barrier layer 12. Next, an organic layer 12a' and an inorganic layer 12b' are formed on the above barrier layer 12 in sequence by the same method as barrier layer 12, to form a barrier layer 12'. The inorganic layers 12b' and 12b respectively of the barrier layers 12' and 12 are adjoined at sidewalls.

An epoxy resin or acrylic polymer solution having a solid content of 1 to 40% by weight of nanometer sized zeolite particles 15 is coated into a pattern on the barrier layer 12 by mechanical coating such as slot die coating or doctor blade coating. The pattern may be one or more squares, a polygon or the combinations thereof, and is dependent on the shape of the organic electroluminescent element 16. Then, the polymer solution is cured by UV light into the getter layer 14. The thickness of the getter layer 14 is about 1 to 50 μm.

Two organic electroluminescent elements 16 are formed on the getter layer 14. In general, the organic electroluminescent element comprises a light emitting layer and two conductive layers sandwiching the light emitting layer. Because the fabrication of the organic electroluminescent element is not a claim of the invention, there will be no further detailed description. One skilled in the art can readily appreciate that one or more than two organic electroluminescent elements can be formed on the getter layer.

Then, two barrier layers 13 and 13' are formed in sequence over the organic electroluminescent element 16 by the same method as the forming of barrier layer 12 to encapsulate the organic electroluminescent element, completing one embodiment of the organic electroluminescent device. One skilled in the art can readily appreciate that one or more than two barrier layers can be formed over the organic electroluminescent element.

In one embodiment of the organic electroluminescent device, the materials of the organic layers in each of the barrier layers over and under the organic electroluminescent element 16 and the getter layer 14 may be the same or different. The materials of the inorganic layers in each of the barrier layers over and under the organic electroluminescent element 16 and the getter layer 14 also can be the same or different. In each of the barrier layers, the thickness of the inorganic layer covering the sidewalls of the organic layer is about 1 mm.

Figure 2:
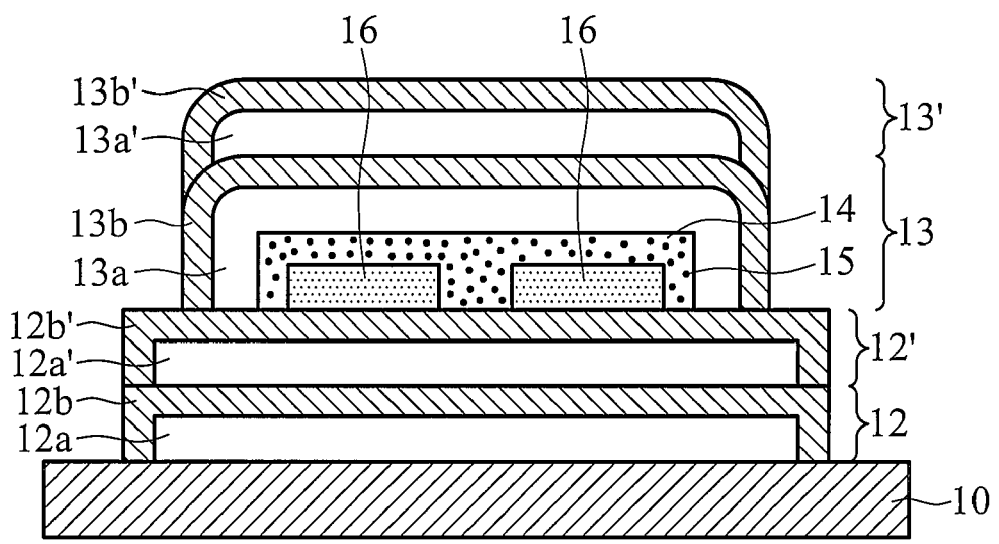
FIG. 2 shows a schematic cross section of an organic electroluminescent device of embodiment 2 of the invention.

Referring to FIG. 2, it is a cross section of the organic electroluminescent device according to embodiment 2 of the invention, wherein the getter layer 14 completely covers the top and sidewall surfaces of the organic electroluminescent element 16. The inorganic layers in the barrier layers of FIG. 2 are adjoined at the sidewalls of the barrier layers to hinder moisture and oxygen coming from passing through the sidewalls.

Figure 6:
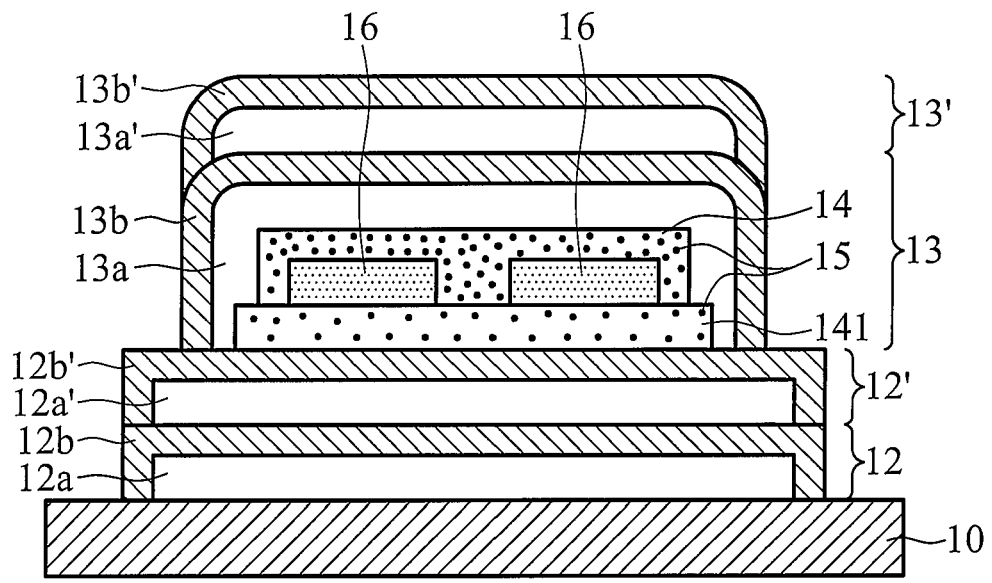
FIG. 6 shows a schematic cross section of an organic electroluminescent device of embodiment 5 of the invention.

Referring to FIG. 6, it is a cross section of the organic electroluminescent device according to embodiment 5 of the invention. In addition to the getter layer 14 of FIG. 2, the organic electroluminescent device of FIG. 6 further comprises a getter layer 141 disposed between the organic electroluminescent element 16 and the barrier layer 12'. The getter layer 141 can adsorb the moisture and oxygen under the organic electroluminescent element 16. The composition and the coating method of the getter layer 141 can be the same as the forming of the getter layer 14.

Figure 4:
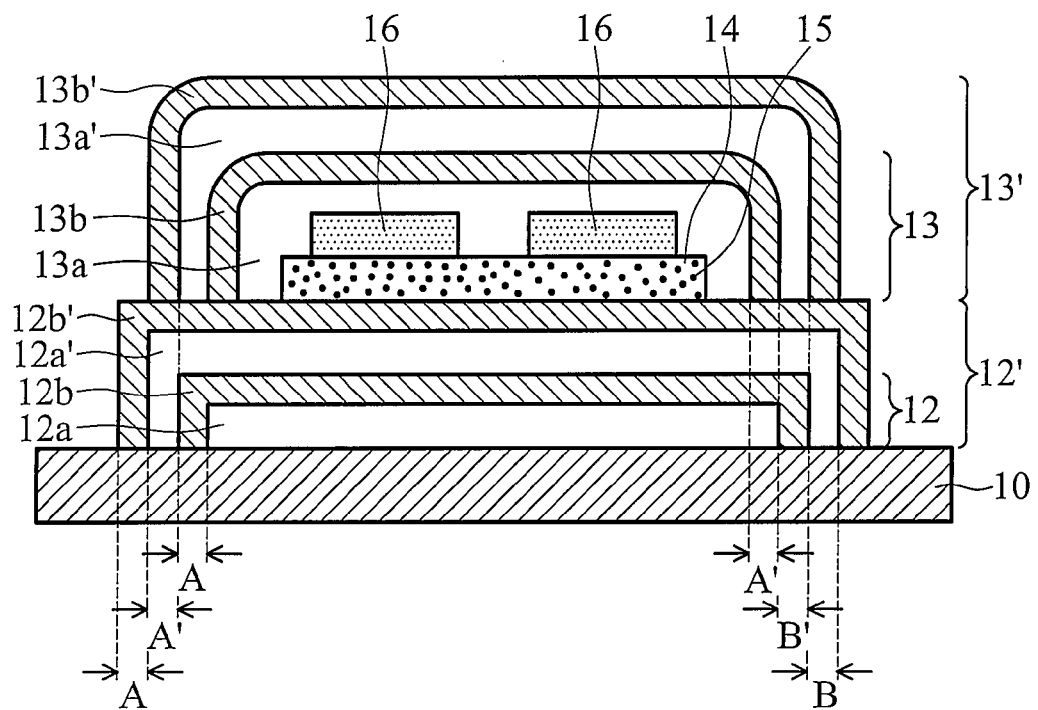
FIG. 4 shows a schematic cross section of an organic electroluminescent device of embodiment 3 of the invention.

Referring to FIG. 4, it is a cross section of the organic electroluminescent device according to embodiment 3 of the invention, wherein the organic layer 12a' of the barrier layer 12' under the organic electroluminescent element 16 completely covers the top and sidewall surfaces of the inorganic layer 12b of the barrier layer 12, and then the inorganic layer 12b' covers the top and sidewall surfaces of the organic layer 12a'. Therefore, the barrier layer 12' completely covers the top and sidewall surfaces of the barrier layer 12 and contacts with the substrate 10. Moreover, the barrier layer 13' over the organic electroluminescent element 16 can be formed by the same method as the forming of barrier layer 12'. The organic layer 13a' completely covers the top and sidewall surfaces of the inorganic layer 13b of the barrier layer 13, and then the inorganic layer 13b' covers the top and sidewall surfaces of the organic layer 13a'. Therefore, the barrier layer 13' completely covers the top and sidewall surfaces of the barrier layer 13 and contacts with the barrier layer 12' under the organic electroluminescent element 16. The getter layer 14 of FIG. 4 is disposed between the organic electroluminescent element 16 and the barrier layer 12' as the same as FIG. 1.

Figure 5:
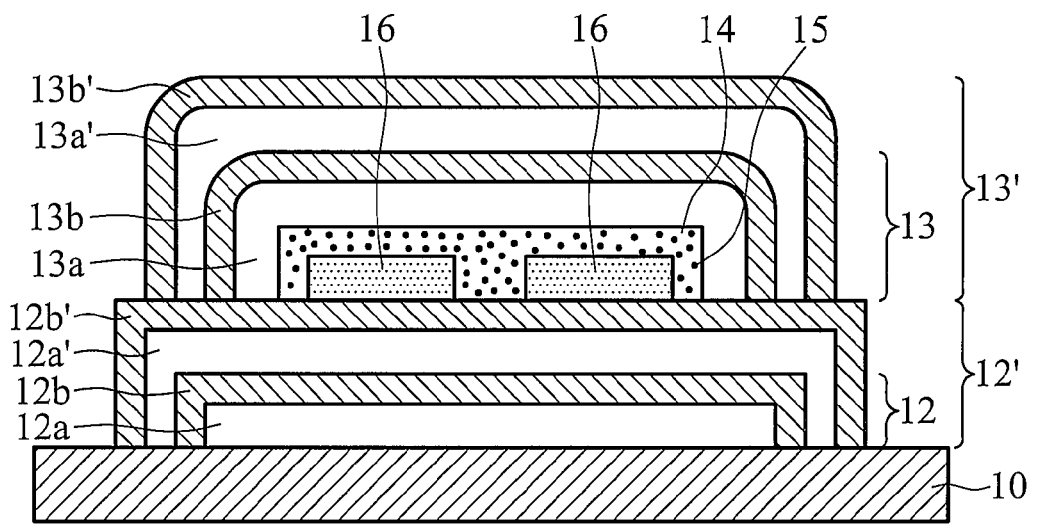
FIG. 5 shows a schematic cross section of an organic electroluminescent device of embodiment 4 of the invention.

Next, referring to FIG. 5, the invention further provides embodiment 4 of the organic electroluminescent device, wherein the organic layer 12a' of the barrier layer 12' under the organic electroluminescent element 16 completely covers the top and sidewall surfaces of the inorganic layer 12b of the barrier layer 12, and then the inorganic layer 12b' covers the top and sidewall surfaces of the organic layer 12a'. Therefore, the barrier layer 12' completely covers the top and sidewall surfaces of the barrier layer 12 and contacts with the substrate 10. Moreover, the organic layer 13a' of the barrier layer 13' over the organic electroluminescent element 16 completely covers the top and sidewall surfaces of the inorganic layer 13b of the barrier layer 13, and then the inorganic layer 13b' covers the top and sidewall surfaces of the organic layer 13a'. Therefore, the barrier layer 13' completely covers the top and sidewall surfaces of the barrier layer 13 and contacts with the barrier layer 12' under the organic electroluminescent element 16. The getter layer 14 of FIG. 5 is disposed between the organic electroluminescent element 16 and the barrier layer 13 as the same as FIG. 2 and completely covers the top and sidewall surfaces of the organic electroluminescent element 16.

In the organic electroluminescent devices of FIGS. 4 and 5, the second barrier layer 13, 13' disposed over the organic electroluminescent element 16 and the first barrier layer 12, 12' disposed under the organic electroluminescent element 16 can be formed as one or more than two barrier layers. The two barrier layers shown in the figures are as examples, not to limit the invention. Moreover, in the organic electroluminescent devices of FIGS. 4 and 5, the organic layer 13a' of the second barrier layer 13' over the organic electroluminescent element 16 has a thickness B' of about 10 μm to 10 mm covering the sidewall surfaces of the inorganic layer 13b, wherein 1 mm is preferred. The organic layer 12a' of the first barrier layer 12' under the organic electroluminescent element 16 has a thickness B of about 10 μm to 10 mm covering the sidewall surfaces of the inorganic layer 12b, wherein 1 mm is preferred. The inorganic layer of each barrier layer has a thickness A, A' of about 10 μm to 10 mm covering the sidewall surfaces of the organic layer, wherein 1 mm is preferred.

Figure 7:
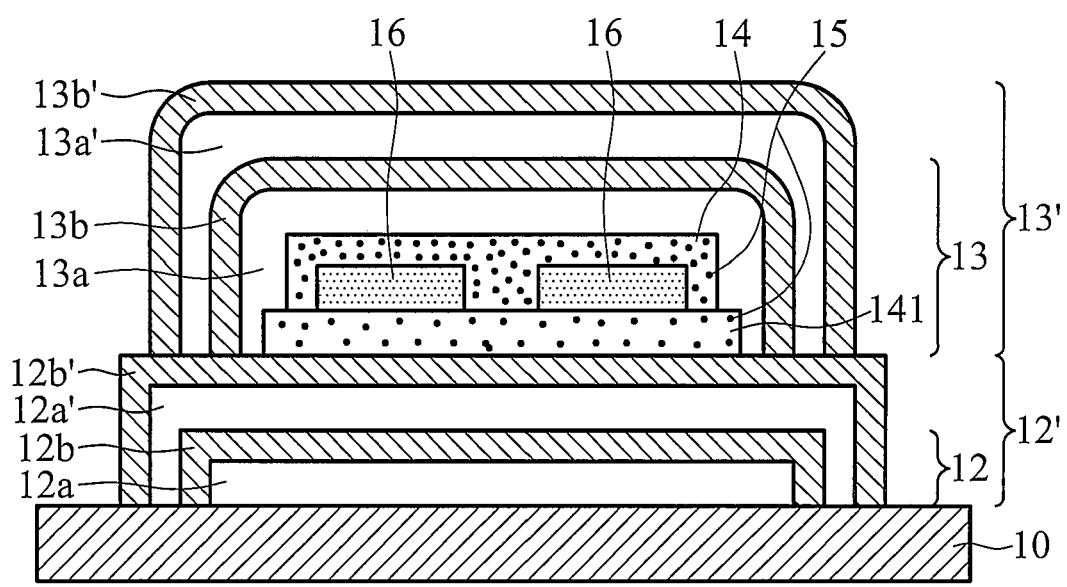
FIG. 7 shows a schematic cross section of an organic electroluminescent device of embodiment 6 of the invention.

Referring to FIG. 7, the invention further provides embodiment 6 of the organic electroluminescent device. In addition to the getter layer 14 of FIG. 5, the organic electroluminescent device of FIG. 7 further comprises a getter layer 141 is disposed between the organic electroluminescent element 16 and the barrier layer 12'. The getter layer 141 can adsorb the moisture and oxygen under the organic electroluminescent element 16. The composition and the coating method of the getter layer 141 can be the same as the forming of the getter layer 14.

Figure 3:
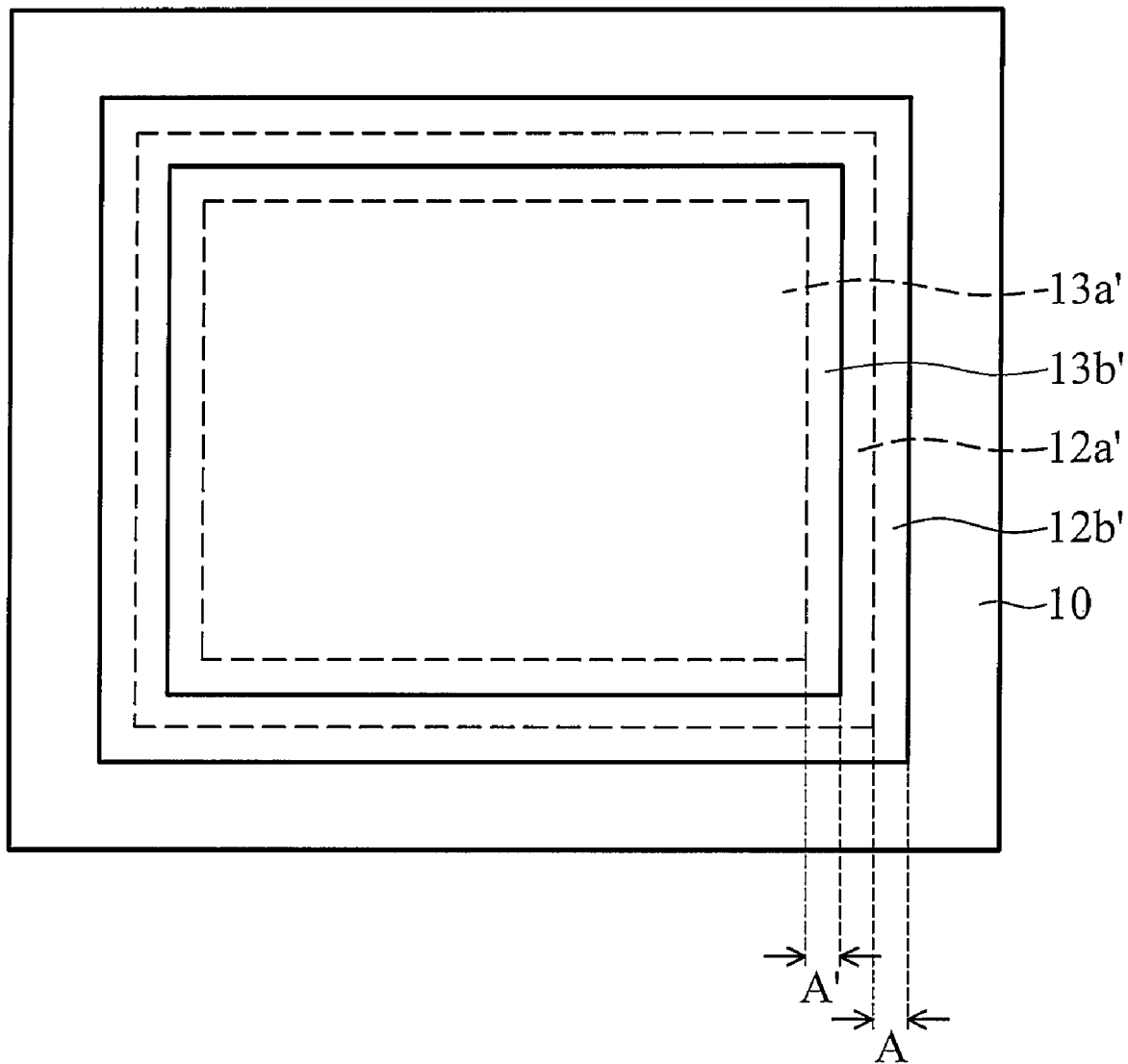
FIG. 3 shows a schematic top view of the organic electroluminescent devices of embodiment 1 and 2.

Referring to FIG. 3, it is a top view of the organic electroluminescent device of embodiment 1 and 2, in which only one barrier layer 12' and one barrier layer 13' are shown as an example. The other barrier layers, the getter layer and the organic electroluminescent element are not shown in FIG. 3. As shown in FIG. 3, the area of the inorganic layer 12b' of the barrier layer 12' and the area of the inorganic layer 13b' of the barrier layer 13' are larger than that of the organic layers 12a' and 13a', respectively. Therefore, the inorganic layer covers all sidewalls of the organic layer. The shape of the barrier layer in FIG. 3 is a square as an example, one skilled in the art can readily appreciate that other shapes of the barrier layer also can be formed dependent on the shape of the organic electroluminescent element 16.

The getter layers 14 and 141 may be formed from a plurality of getter particles 15 dispersed in a polymer matrix 14. The thickness of one getter layer is about 1 to 50 μm. The polymer matrix may be epoxy resin or acrylic polymer which can be formed into a pattern on the barrier layer by mechanical coating, and then cured by UV light or thermal polymerization. The getter particles may be alkaline-earth metal oxide, zeolite, silica, aluminum silicate or combinations thereof, wherein nanometer sized zeolite particle is preferred. The solid content of the getter particles in the polymer matrix is about 1 to 40% by weight. Before encapsulating the organic electroluminescent element 16, the getter layer can be subjected to decompression, heating or combinations thereof to remove gas and moisture adsorbed therein.

One feature of the invention as shown in FIG. 3 is the inorganic layers completely covering the top and sidewall surfaces of the organic layers. For barrier layer 12' and barrier layer 13', the areas of the inorganic layers 12b' and 13b' are larger than that of the organic layers 12a' and 13a', respectively. The width of the inorganic layer from the organic layer for a single side, i.e., A or A', is about 10 μm to 10 mm, wherein 1 mm is preferred.

Furthermore, in some embodiment, another feature of the invention is that the inorganic layers at the sidewalls of the barrier layers are adjoined on each other while a plurality of barrier layers is stacked. The second barrier layers 13 and 13' over the organic electroluminescent element and the first barrier layers 12 and 12' under the organic electroluminescent element are stacked on each other and the inorganic layers of the first and the second barrier layers are adjoined on each other. Moreover, in the second barrier layer over the organic electroluminescent element and the first barrier layer under the organic electroluminescent element, the upper barrier layer covers the top surface of the lower barrier layer and the sidewalls of each barrier layer are aligned to each other.

In another embodiment, one feature of the invention is that the inorganic layers at the sidewalls of the barrier layers are adjoined on each other while a plurality of barrier layers is stacked. Moreover, in the second barrier layer over the organic electroluminescent element and the first barrier layer under the organic electroluminescent element, the upper barrier layer completely covers the top and sidewall surfaces of the lower barrier layer.

In some embodiment, the water permeability rate of the inorganic layer is about $10^{-2}$ g/m$^2$ day, and a water permeability rate of the organic layer is about $10^2$ g/m$^2$ day. The water permeability rate of the inorganic layer is lower than that of the organic layer for the same thickness. Thus, the stacked structure of the inorganic layers of the barrier layers of the invention can effectively hinder moisture and oxygen from passing through the sidewalls.

The above organic layers in the barrier layers may be a UV curable polymer, a thermosetting polymer or a parylene polymer. The UV curable or thermosetting polymer may be epoxy resin or acrylic polymer. Parylene polymers such as parylene-N with formula of $(CH_2-C_6H_4-CH_2)_n$, parylene-C with formula of $(CH_2-C_6H_3Cl-CH_2)_n$, parylene-D with formula of $(CH_2-C_6H_2Cl_2-CH_2)_n$, parylene-AF4 with formula of $(CF_2-C_6H_4-CF_2)_n$, or combinations thereof may be utilized. The inorganic layer may be $SiO_2$, $Si_3N_4$, $Al_2O_3$, AlN, $TiO_2$, TiN, $Cr_2O_3$, SiC, diamond-like carbon (DLC) or combinations thereof.

In addition, the organic electroluminescent device of the invention uses one supporting substrate and a plurality of barrier layers for encapsulating the organic electroluminescent element. The substrate may be a flexible substrate, and the materials of the matrices of the organic layer and the getter layer may be a flexible polymer, thus the organic electroluminescent device is applicable for a flexible organic electroluminescent device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electroluminescent device, comprising:
a substrate;
a first barrier layer disposed on the substrate;
an organic electroluminescent element disposed over the first barrier layer;
a second barrier layer disposed over and encapsulating the organic electroluminescent element; and
a first getter layer disposed between the organic electroluminescent element and the second barrier layer, wherein the first getter layer directly wraps around the top and sidewall surfaces of the organic electroluminescent element, and the first getter layer comprises a polymer matrix and a plurality of getter particles dispersed in the polymer matrix,
wherein each of the first and the second barrier layers includes an organic layer and an inorganic layer covering the top and sidewall surfaces of the organic layer, such that the inorganic layers of the first and the second barrier layers are adjoined at the sidewalls.

2. The organic electroluminescent device as claimed in claim 1, further comprising a second getter layer disposed between the organic electroluminescent element and the first barrier layer.

3. The organic electroluminescent device as claimed in claim 2, wherein the second getter layer has a thickness of 1 to 50 μm.

4. The organic electroluminescent device as claimed in claim 2, wherein the second getter layer comprises a polymer matrix and a plurality of getter particles dispersed in the polymer matrix.

5. The organic electroluminescent device as claimed in claim 4, wherein the polymer matrix comprises epoxy resin or acrylic polymer.

6. The organic electroluminescent device as claimed in claim 2, wherein the first or the second getter layer is subjected to decompression, heating or combinations thereof to remove gas adsorbed therein.

7. The organic electroluminescent device as claimed in claim 1, further comprising a plurality of first barrier layers stacked on each other.

8. The organic electroluminescent device as claimed in claim 7, wherein the sidewalls of the first barrier layers are aligned to each other.

9. The organic electroluminescent device as claimed in claim 7, wherein the upper first barrier layer completely covers the top and sidewall surfaces of the lower first barrier layer.

10. The organic electroluminescent device as claimed in claim 1, further comprising a plurality of second barrier layers stacked on each other.

11. The organic electroluminescent device as claimed in claim 10, wherein the sidewalls of the second barrier layers are aligned to each other.

12. The organic electroluminescent device as claimed in claim 10, wherein the upper second barrier layer completely covers the top and sidewall surfaces of the lower second barrier layer.

13. The organic electroluminescent device as claimed in claim 1, wherein the first getter layer has a thickness of 1 to 50 μm.

14. The organic electroluminescent device as claimed in claim 1, wherein the inorganic layer covers the sidewall surfaces of the organic layer with a width of 10 μm to 10 mm.

15. The organic electroluminescent device as claimed in claim 1, wherein the organic layer comprises UV curable polymer, thermosetting polymer or parylene polymer.

16. The organic electroluminescent device as claimed in claim 15, wherein the parylene polymer comprises parylene-N, parylene-C, parylene-D, parylene-AF4 or combinations thereof.

17. The organic electroluminescent device as claimed in claim 1, wherein the inorganic layer comprises $SiO_2$, $Si_3N_4$, $Al_2O_3$, AlN, $TiO_2$, TiN, $Cr_2O_3$, SiC, diamond-like carbon (DLC) or combinations thereof.

* * * * *